United States Patent
Toeppen et al.

[11] Patent Number: 5,900,755
[45] Date of Patent: * May 4, 1999

[54] PHASE DITHER OF AN ACQUISITION CLOCK USING A PHASE LOCK LOOP

[75] Inventors: Derek E. Toeppen; B. Allen Montijo; Reginald Kellum, all of Colorado Springs, Colo.

[73] Assignee: Hewlett-Packard, Co., Palo Alto, Calif.

[ * ] Notice: This patent is subject to a terminal disclaimer.

[21] Appl. No.: 08/909,146

[22] Filed: Aug. 11, 1997

Related U.S. Application Data

[63] Continuation of application No. 08/548,156, Oct. 25, 1995, abandoned.

[51] Int. Cl.[6] .................................................. H03L 7/06
[52] U.S. Cl. ...................... 327/163; 327/158; 327/159; 324/121 R; 324/79.15; 324/76.24
[58] Field of Search .................................. 327/147, 149, 327/150, 156, 158, 159, 161, 162, 163; 324/121 R, 76.15, 76.24; 331/1 A, 57, DIG. 2; 375/376; 364/487; 345/134

[56] References Cited

U.S. PATENT DOCUMENTS

| | | | |
|---|---|---|---|
| 4,077,016 | 2/1978 | Sanders et al. | 331/DIG. 2 |
| 4,388,598 | 6/1983 | Egan | 331/DIG. 2 |
| 4,724,401 | 2/1988 | Hogge, Jr. et al. | 331/DIG. 2 |
| 5,115,189 | 5/1992 | Holcomb | 324/121 R |
| 5,180,971 | 1/1993 | Montijo | 324/121 R |
| 5,451,910 | 9/1995 | Guthrie | 327/159 |
| 5,521,947 | 5/1996 | Madsen | 327/156 |
| 5,579,184 | 11/1996 | Nakanishi et al. | 360/51 |

*Primary Examiner*—Kenneth B. Wells
*Attorney, Agent, or Firm*—Alexander J. Neudeck

[57] ABSTRACT

The phase of an acquisition clock for a digital oscilloscope is modulated by summing an offset voltage with the output of the phase detector of a phase lock loop. The offset voltage is generated by a digital-to-analog converter which is fed input values by a microprocessor running a number generator routine.

13 Claims, 5 Drawing Sheets

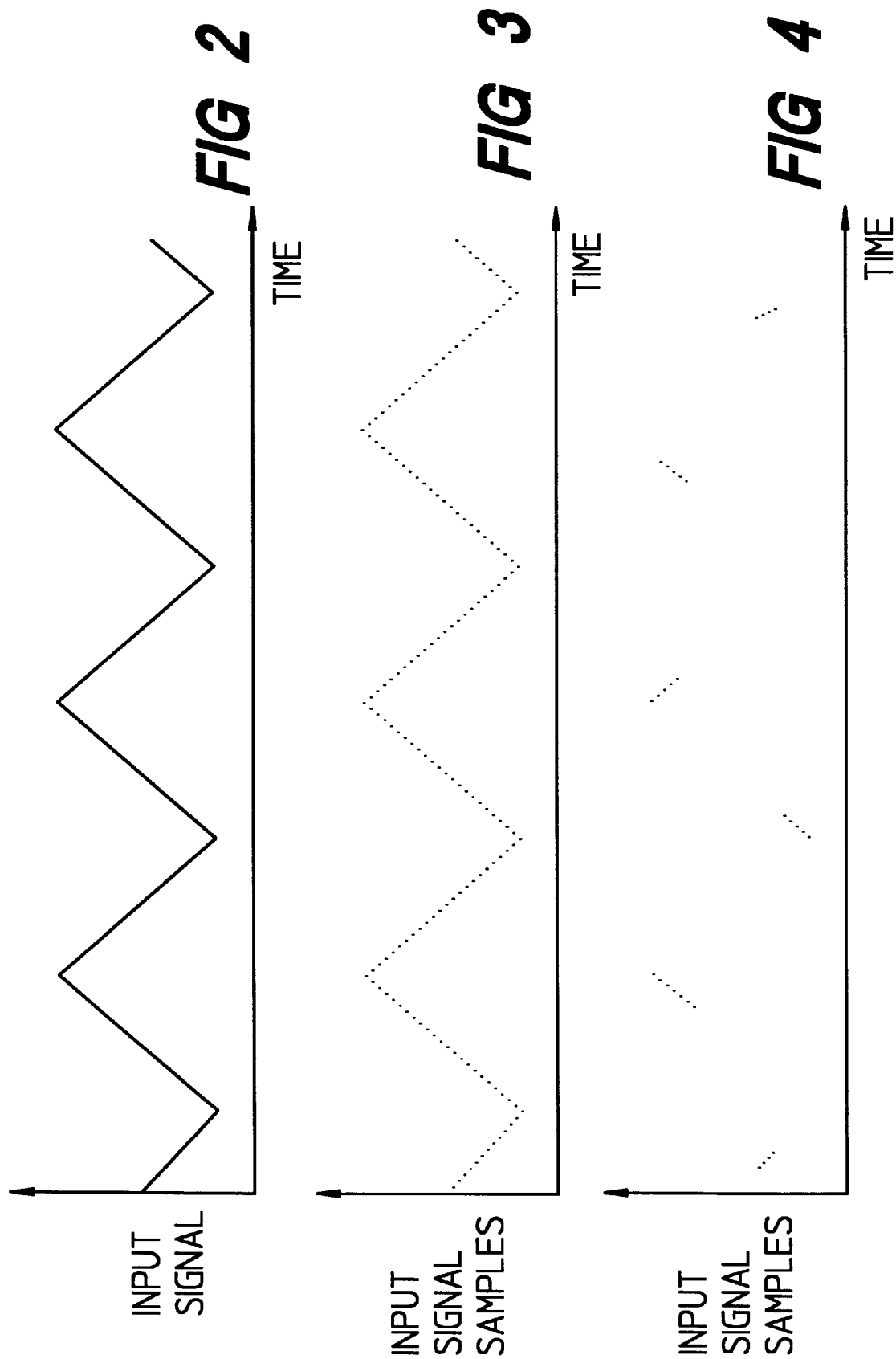

PHASE DITHER OF AN ACQUISITION CLOCK USING A PHASE LOCK LOOP

This a continuation of application Ser. No. 08/548,156 filed on Oct. 25, 1995, now abandoned.

BACKGROUND OF THE INVENTION

Field Of The Invention

The present invention relates to the acquisition of digital waveform data. More particularly, it relates to acquiring digital waveform data of time varying waveforms for display on a digital oscilloscope.

Statement Of The Problem

Digital oscilloscopes may rely on a technique called "random repetitive sampling" to display signals which have a much higher frequency than the sampling rate. This is achieved by letting the sample clock free run and then measuring the time delay between the trigger and the first sample of an acquisition. As long as the sample clock and the signal being sampled have little or no phase and/or frequency correlation, the time between the trigger and the first sample (and hence subsequent samples) will be random. This random time difference ensures that the points sampled are randomly distributed along the waveform and allows a waveform display to be built from multiple triggers and acquisition cycles.

If, however, the sample clock and the signal being sampled are correlated, the time between the trigger and the first sample will be approximately the same for each acquisition cycle. This causes each acquisition cycle to sample the same parts of the waveform as the previous acquisition cycles. Therefore, since only a limited part of the waveform is getting sampled, an accurate picture of the waveform cannot be displayed when the sample clock and the signal being sampled are correlated.

SUMMARY OF THE INVENTION

Solution To The Problem

The present invention prevents correlation between the acquisition clock and the sampled waveform by generating the acquisition clock with a phase lock loop and changing the phase of the acquisition clock between acquisition cycles by adding an offset to the input of the loop filter. The offset creates a phase error that the loop corrects by changing the phase of the acquisition clock. These resulting phase modulations can be made to occur only between acquisition cycles by only changing the offset between acquisition cycles. The offset may be generated by a digital-to-analog converter ("DAC") which is fed a random, pseudo-random, or predetermined numbers. If a DAC is used, the resolution of the DAC determines the resolution of the possible phase changes.

BRIEF DESCRIPTION OF THE DRAWINGS

FIG. 2 is an example input signal.

FIG. 3 is a plot of input signal samples when the acquisition clock and the input signal are uncorrelated.

FIG. 4 is a plot of input signal samples when the acquisition clock and the input signal are synchronized or highly correlated.

DESCRIPTION OF THE PREFERRED EMBODIMENTS

The present invention will be described in terms of a number of different embodiments. The preferred embodiment is a method and apparatus for preventing correlation between a waveform being sampled and the acquisition clock of a digital oscilloscope by modulating the phase of the acquisition clock. The acquisition clock is generated by a phase locked loop. The phase of the acquisition clock is modulated by adding an offset to the input of the phase locked loop's loop filter. The offset is generated by inputting values to the input of a digital-to-analog converter. The output of the digital-to-analog converter is changed between acquisition cycles. The values are input to the DAC are generated by software executing on a microprocessor. In another preferred embodiment, the acquisition clock is generated by a delay locked loop and the phase of the acquisition clock is modulated by adding an offset to the input of the delay locked loop's loop filter.

Figure 1:
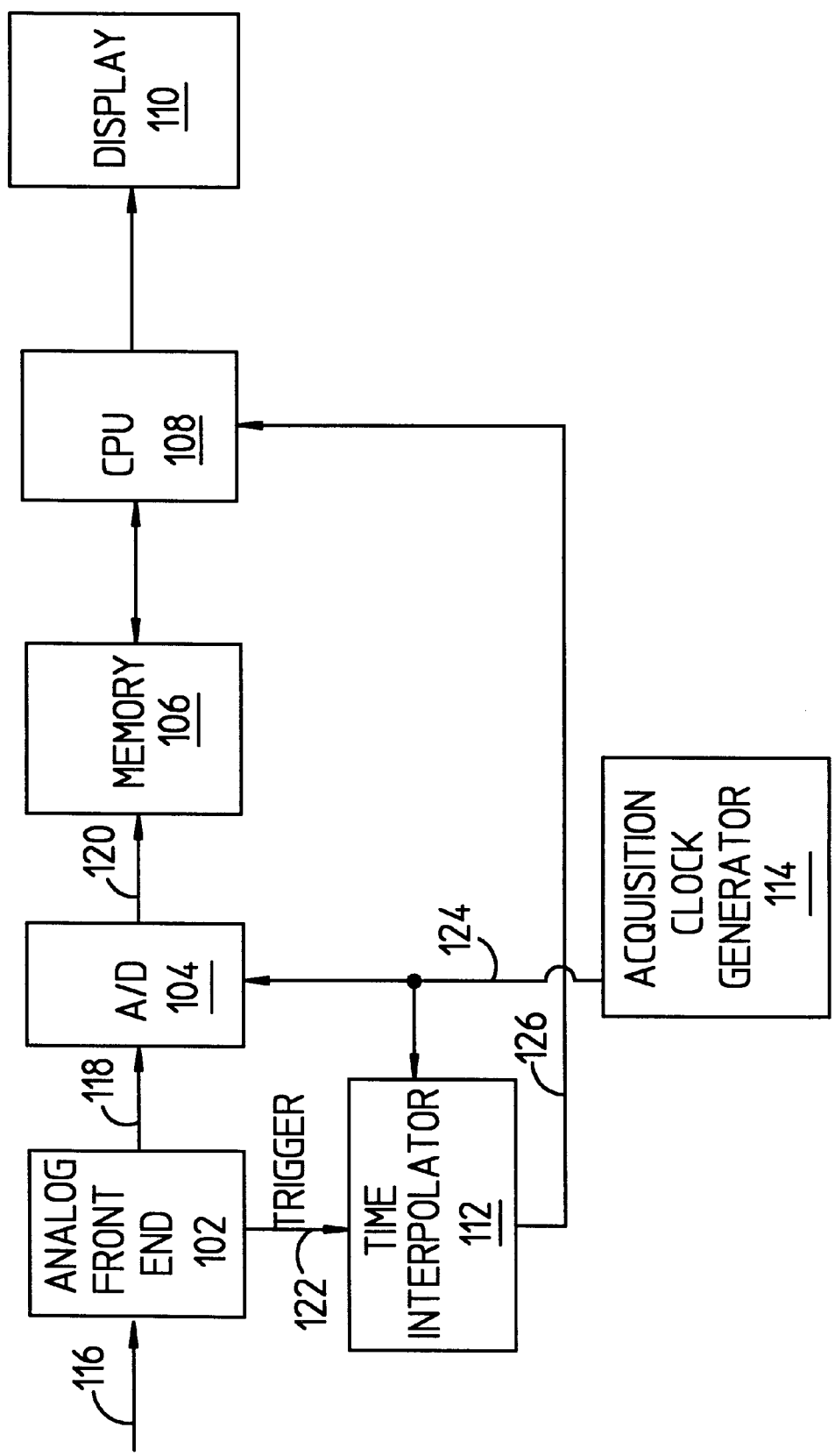
FIG. 1 is a basic block diagram of a digital oscilloscope implementing the present invention.

FIG. 1 shows a basic block diagram of a digital oscilloscope implementing the present invention. An analog input 116 is received and fed to an analog front end 102. The analog front end 102 produces an output 118 which is fed to the analog-to-digital converter ("A/D") 104 and a trigger signal 122 which is fed to a time interpolator 112. The A/D's sample times are controlled by an acquisition clock 124 which is generated by an acquisition clock generator 114. The digital waveform samples 120 taken by the A/D 104 are stored in a memory 106. This memory is read by a microprocessor or other state machine ("CPU") 108 and displayed on a raster display device 110. The acquisition clock 124 is also fed to the time interpolator 112. The time interpolator measures the time delay between the trigger signal 122 and the acquisition clock 124 and feeds that value 126 to the CPU 108. The CPU uses the output of the time interpolator 126, and the sampled data points 120, to determine which pixels on display 110 to illuminate.

If it is assumed that the trigger occurs at the same point on the waveform every time, and there is a random, or at least well distributed, period of time from the trigger to the first sample of each acquisition cycle, each acquisition cycle will obtain its samples from different points on the waveform. Because the delay between the trigger and the first sample of each acquisition cycle is measured, and the time between the first sample and subsequent samples are known multiples of the acquisition clock period, the appropriate location to display each point of data from each acquisition cycle can be determined. Also, since the delay from the trigger to each point displayed is well distributed, many points along the waveform are illuminated. By accumulating points which are well distributed along the waveform, the waveform becomes visible. This is illustrated by FIG. 3 which is a plot of many well distributed samples from the input waveform shown in FIG. 2.

Unfortunately, a problem occurs when the waveform being sampled and the acquisition clock are synchronized or highly correlated. This can occur, for example, when the frequency of waveform being sampled is an integer multiple of the frequency of the acquisition clock. When the time between the trigger and the first sample is always approximately the same, roughly the same part of the input waveform is sampled and displayed each time. This is illustrated by the plot of samples shown in FIG. 4. Clearly, the display which would result from the samples in FIG. 4 is a useless representation of the waveform.

Figure 5:
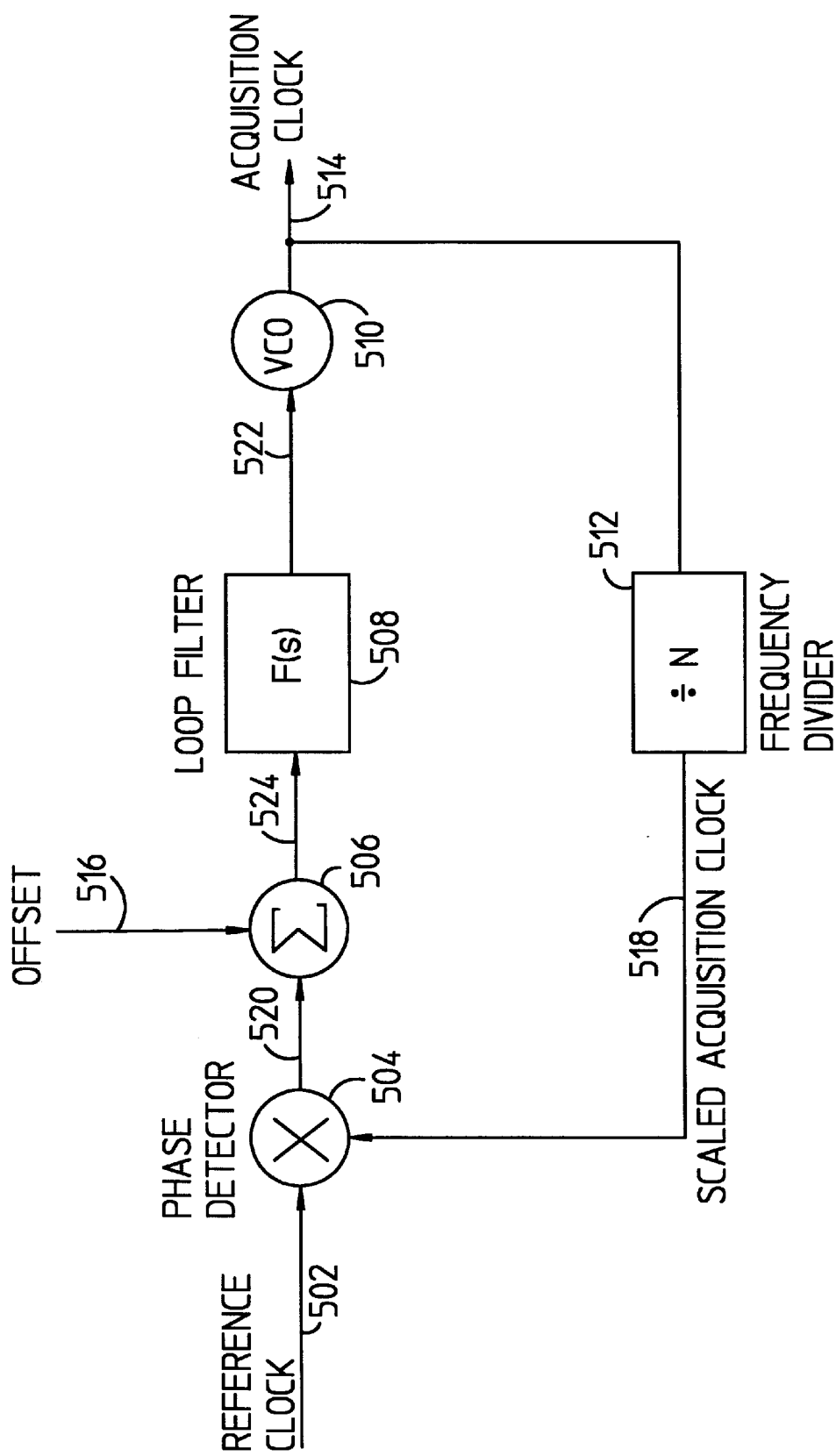
FIG. 5 is a block diagram of a phase locked loop which can have the phase of its output controlled.

FIG. 5 shows a block diagram of an acquisition clock generator (114 of FIG. 1) using a phase locked loop which can have the phase of its output adjusted by an offset. Reference clock 502 is fed to a phase detector 504. The phase detector compares the phase of the reference clock 502 and the scaled acquisition clock 518. The output of the phase detector 520 is added to the offset 516 by adder 506. The output of the phase detector 520, and/or the offset 516 may be either a current or a voltage. The sum of the phase detector 520 and the offset 516 is fed to loop filter 508. The output of the loop filter 522 controls voltage controlled oscillator ("VCO") 510. The acquisition clock 514 is taken from the output of the VCO. In another embodiment, the VCO 510 could be replaced by a current controlled oscillator ("CCO").

The acquisition clock 514 is also connected to a frequency divider 512 which divides the frequency of the acquisition clock to produce a scaled acquisition clock 518. The scaled acquisition clock 518 is fed to the phase detector 504. When the offset 516 is non-zero, it forces the system to maintain a phase difference between the reference clock 502 and the scaled acquisition clock 518 so that the output of the phase detector 520 will cancel out the offset 516 and the input to the loop filter 524 will be zero. When the input to the loop filter 524 is zero, the system is "locked" and both the phase and frequency of the acquisition clock 514 are constant. The amount of phase difference the system must maintain depends directly on the offset 516. Therefore, the phase of the acquisition clock 514 can be controlled by the offset 516.

Figure 6:
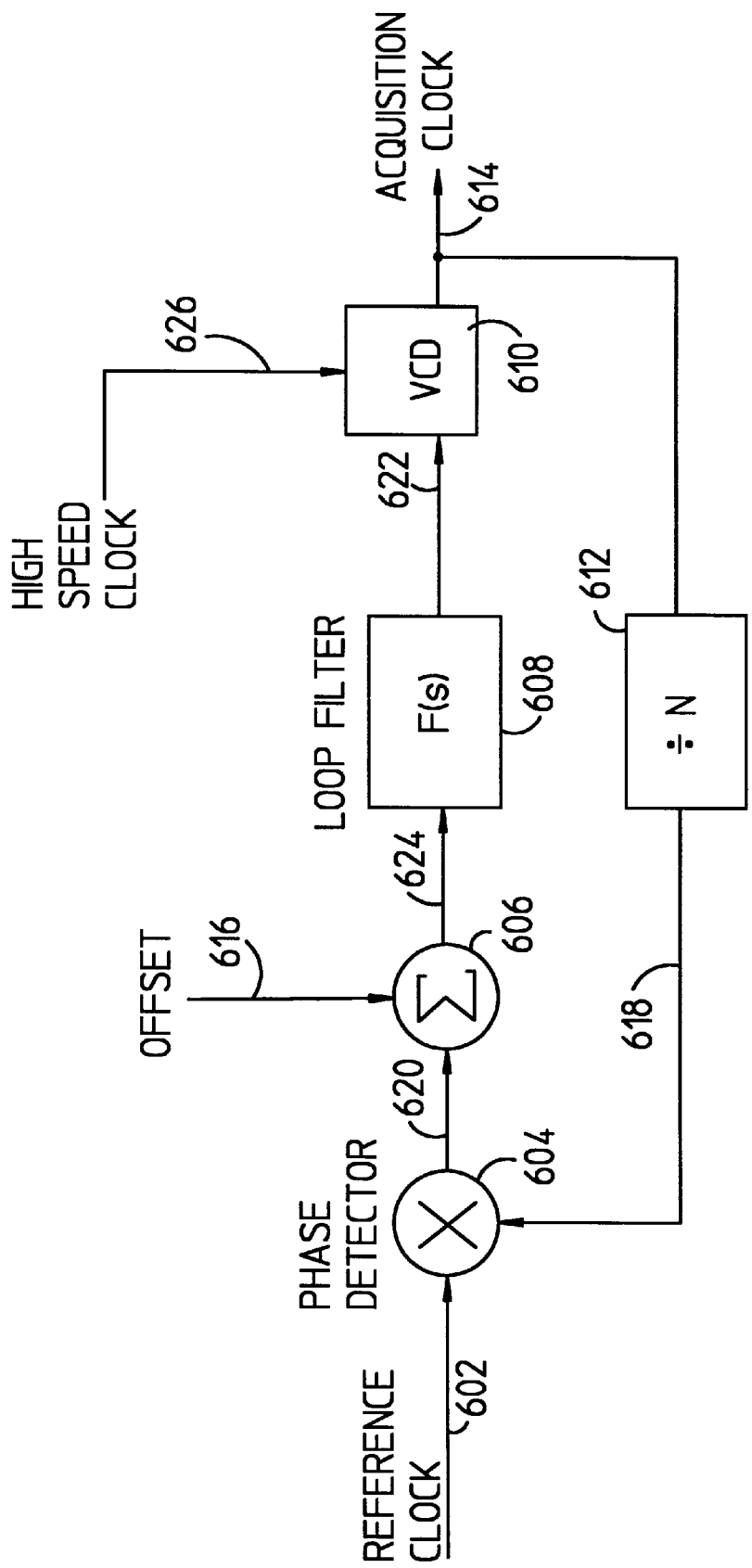
FIG. 6 is a block diagram of a delay locked loop which can have the phase of its output controlled.

FIG. 6 shows a block diagram of an acquisition clock generator (114 of FIG. 1) using a delay locked loop which can have the phase of its output adjusted by an offset. Reference clock 602 is fed to a phase detector 604. The phase detector compares the phase of the reference clock 602 and the scaled acquisition clock 618. The output of the phase detector 620 is added to the offset 616 by adder 606. The output of the phase detector 620, and/or the offset 616 may be either a current or a voltage. The sum of the phase detector 620 and the offset 616 is fed to loop filter 608. The output of the loop filter 622 controls the delay of the high speed clock 626 through the voltage controlled delay ("VCD") 610. The acquisition clock 614 is taken from the output of the VCD. The acquisition clock 614 is sent through a frequency divider to generate a scaled acquisition clock 618. The high speed clock 626 may be the reference clock 602 if the acquisition clock bypasses the frequency divider and is sent directly to the phase detector 604, or if the frequency divider 612 is set to divide by one. The frequency of the high speed clock 626 should equal the frequency of the reference clock 602 times the divide ratio of the frequency divider 612. In another embodiment, the VCD 610 could be replaced by a current controlled delay.

Figure 7:
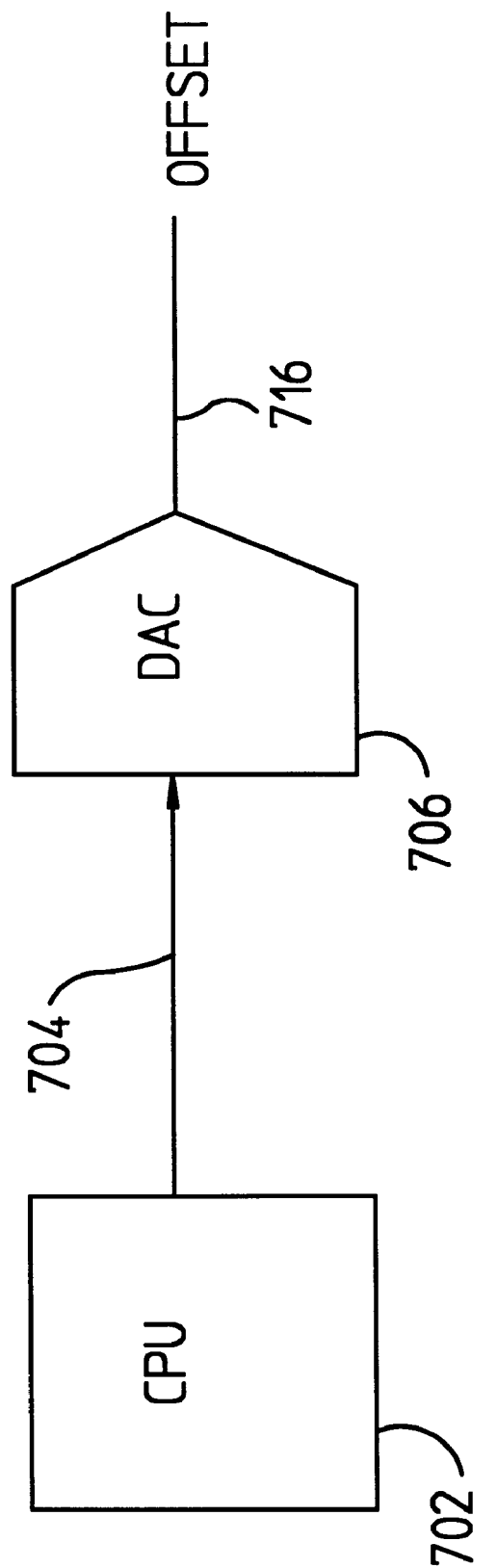
FIG. 7 is a block diagram of a way to generate the offset.

FIG. 7 shows a block diagram of a way to generate the offset 516 of FIG. 5 and 616 of FIG. 6. A microprocessor 702 is programmed to generate a series of numbers. These numbers 704 are supplied as the input to a DAC 706. The output of the DAC is then used as offset 516 or 616. These numbers may be random, pseudo-random, or follow a predetermined sequence. If the input to the DAC is a series of random numbers, the offset will be random. If the offset is random, the phase of the acquisition clocks 514 and 614 will be random.

A predetermined sequence may also be chosen for the input to the DAC 704. This would allow, for example, the acquisition clock to hit all possible phase changes over a number of acquisition cycles.

If the microprocessor 702 only changes the input to the DAC between acquisition cycles, the phase locked loop of FIG. 5 and the delay locked loop of FIG. 6 can be given enough time to reach a "locked" state before the next acquisition cycle begins. This will ensure that both the phase and frequency of the acquisition clock will be constant during the acquisition cycle. When the phase and frequency of the acquisition clock are constant, it allows the CPU 108 of FIG. 1 to accurately position each point on the display 110 of FIG. 1. The amount of time required for the phase locked loop of FIG. 5 and the delay locked loop of FIG. 6 to reach a "locked" state is determined by the response of the loop filter 508 and 608 respectively, and can be designed to provide a phase change fast enough to allow phase changes between acquisitions without slowing the acquisition rate. In addition, the maximum phase step between acquisitions can be limited by limiting each number input to the DAC to a certain range around the last number input to the DAC. Limiting the maximum phase step would speed settling time. The microprocessor 702 may be the same as the CPU 108 of FIG. 1.

The reference clock 502 may be generated by a crystal oscillator such as an SG-51PJ-25.000MC made by Epson America, Inc. This part produces a TTL level clock signal of 25 MHZ. The TTL level reference clock can be converted to ECL logic levels by a TTL to ECL converter chip 10H124 made by Motorola Inc. The ECL reference clock signal can then be fed to the phase detector. The phase detector may be an MC12040 made by Motorola Inc. The adder 506 and the loop filter may be implemented using two OP-27 operation amplifiers from Analog Devices Inc. or equivalents. The first OP-27 may be configured to convert the output of the phase detector to a specified output level and output impedance. The second OP-27 may be configured as a summing integrator. The output of the first OP-27 is summed with the controlled impedance offset signal and the result is integrated by the second OP-27. The output of the second OP-27 is fed to the VCO 510. The VCO 510 may be a MC12148 made by Motorola Inc. The output of the VCO may be fed to a 10E101 made by Motorola Inc. to convert it from PECL (Positive ECL) logic levels to ECL logic levels. The output of the 10E101 may then be fed to the frequency divider 512 which may be a 10E131 made by Motorola Inc. configured to divide the input frequency by sixteen or a custom integrated circuit. The offset 516 may be generated by a DAC-08 digital-to-analog converter connected to an OP-27 to provide controlled levels and a controlled output impedance. The DAC-08 or equivalent is available from Analog Devices Inc. The input to the DAC-08 may be a sequence of numbers provided by a microprocessor executing a random number generator routine. In another embodiment, the phase detector 504, and the frequency divider 512 may be implemented on a custom integrated circuit.

It is to be understood that the claimed invention is not to be limited by the preferred embodiments but encompasses other modifications and alterations within the scope and spirit of the inventive concept. For example, a DAC controlled by a microprocessor is used to generate an offset. Other apparatus and methods could be used as a randomizer to generate a random offset. One example of a randomizer would involve feeding a noise source to a sample and hold circuit. This would provide a random voltage which could be controlled to change between acquisition cycles. An example of another type of phase lock loop would involve eliminating the frequency divider 512 in FIG. 5. This would eliminate the frequency multiplication function of the phase lock loop, but not affect the ability of the offset to alter the phase of the acquisition clock 514.

We claim:

1. A digital sampling system, comprising:

an A/D converter having a sample clock input and an analog input;

a phase locked loop, said phase locked loop including a clock input, a clock output, and an offset input that controls the phase difference between a reference clock signal and an output clock signal, said reference clock signal being applied to said clock input, said output clock signal being output by said phase locked loop at said clock output, and said output clock signal being applied to said sample clock input; and means for generating an offset signal, said offset signal being applied to said offset input, whereby said offset signal varies in time causing the phase difference between the reference clock signal and the output clock signal to vary in time thereby preventing correlation between said output clock signal and an analog input signal, said analog input signal being applied to said analog input.

2. The apparatus of claim 1, wherein said means for generating an offset signal comprises a digital-to-analog converter.

3. The apparatus of claim 2, wherein said digital-to-analog converter further comprises a DAC input that is a binary number with a fixed number of binary digits and said binary number changes value at predetermined intervals.

4. The apparatus of claim 3, wherein said binary number changes to all values possibly represented by said fixed number of binary digits over a fixed period of time.

5. The apparatus of claim 4, wherein said binary number is generated by a microprocessor.

6. The apparatus of claim 5, wherein said microprocessor generates random values for said binary number.

7. The apparatus of claim 5, wherein said microprocessor generates values for said binary number that statistically approximate a random series of binary numbers.

8. A digital oscilloscope having acquisition cycles, comprising:

an A/D converter having a sample clock input and an analog input;

a phase locked loop, said phase locked loop including a clock input, a clock output, and an offset input that controls the phase difference between a reference clock signal and an output clock signal, said reference clock signal being applied to said clock input, said output clock signal being output by said phase locked loop at said clock output, and said output clock signal being applied to said sample clock input; and means for generating an offset signal, said offset signal being applied to said offset input, said offset signal being constant during said acquisition cycles, whereby said offset signal varies between acquisition cycles causing the phase difference between the reference clock signal and the output clock signal to vary between acquisition cycles while remaining constant during acquisition cycles thereby preventing correlation between said output clock signal and an analog input signal, said analog input signal being applied to said analog input.

9. The apparatus of claim 8, wherein said means for generating an offset signal comprises a digital-to-analog converter.

10. The apparatus of claim 9, wherein said digital-to-analog converter further comprises a DAC input that is a binary number with a fixed number of binary digits and said binary number changes value between said acquisition cycles.

11. The apparatus of claim 10, wherein said binary number does not change value during said acquisition cycles.

12. A method of digitally sampling an analog signal, comprising the steps of:

(a) sampling a fixed number of digital samples of said analog signal with an A/D converter, said A/D converter including a sample clock input;

(b) applying a sample clock signal to said sample clock input;

(c) changing the phase of said sample clock signal thereby preventing correlation between said analog signal and said sample clock signal, wherein said sample clock signal is generated by a phase locked loop, said phase locked loop including a clock input, a clock output, and an offset input that controls the phase difference between a reference clock signal and an output clock signal, and said output clock signal is used as said sample clock signal, and wherein said offset input varies in time to cause said changing of the phase of said sample clock signal; and (d) repeating steps (a), (b), and (c).

13. The method of claim 12, wherein step (c) does not occur while step (a) is being performed.

\* \* \* \* \*